(12) United States Patent
King, Jr. et al.

(10) Patent No.: US 10,529,214 B2
(45) Date of Patent: Jan. 7, 2020

(54) SHOCK AWARENESS SYSTEM

(71) Applicant: SHOCK ALERT LLC, O'Fallon, MO (US)

(72) Inventors: L. Herbert King, Jr., Chesterfield, MO (US); James Keeven, O'Fallon, MO (US); William Hiner, O'Fallon, MO (US); Frank Vlasaty, Lake St. Louis, MO (US)

(73) Assignee: SHOCK ALERT LLC, O'Fallon, MO (US)

( * ) Notice: Subject to any disclaimer, the term of this patent is extended or adjusted under 35 U.S.C. 154(b) by 0 days.

(21) Appl. No.: 15/732,238

(22) Filed: Oct. 10, 2017

(65) Prior Publication Data

US 2019/0108744 A1    Apr. 11, 2019

Related U.S. Application Data

(63) Continuation-in-part of application No. 14/999,165, filed on Apr. 5, 2016, now Pat. No. 10,288,662, which is a continuation-in-part of application No. 14/998,497, filed on Jan. 12, 2016, now Pat. No. 9,678,119, which is a continuation of application No. 13/987,731, filed on Aug. 26, 2013, now Pat. No. (Continued)

(51) Int. Cl.
| | |
|---|---|
| *G08B 21/08* | (2006.01) |
| *G01R 19/165* | (2006.01) |
| *F21V 23/04* | (2006.01) |
| *G01R 27/08* | (2006.01) |
| *G01R 27/22* | (2006.01) |
| *G01R 19/145* | (2006.01) |

(52) U.S. Cl.
CPC ........ *G08B 21/082* (2013.01); *F21V 23/0442* (2013.01); *G01R 19/145* (2013.01); *G01R 19/1659* (2013.01); *G01R 27/08* (2013.01); *G01R 27/22* (2013.01)

(58) Field of Classification Search
CPC .. B63G 2009/005; B63H 20/20; B63H 21/22; G01S 13/862; G01S 13/9307; G08B 13/1965; G08B 13/1966; G08B 13/19682; G08B 13/19684; G08B 13/19697; G08B 25/085; G08B 25/14; G08G 3/02; Y10T 477/677
USPC ... 340/539.1, 870.02, 539.13, 539.2, 539.21, 340/547, 551, 568.2, 573.6, 580, 605, 340/618, 636.1, 636.11, 635
See application file for complete search history.

(56) References Cited

U.S. PATENT DOCUMENTS 8,800,466 B1 * 8/2014 Shimozono ............... B63B 1/22
114/345
9,506,957 B1 * 11/2016 Branstetter ...... G01R 19/16533
(Continued)

FOREIGN PATENT DOCUMENTS

CN    107 093 310    8/2017

*Primary Examiner* — Daniel Previl
(74) *Attorney, Agent, or Firm* — Johnson & Phung LLC

(57) ABSTRACT

A shock awareness system including a shock detector for measuring an electrical condtion in a body of water and a remote station in communication with the shock detector with the shock awareness system displaying a measured electrical condtion in the body of water in relation to a known hazardous electrical condtion in the body of water to enable an operator to determine a level of danger in a body of water.

13 Claims, 5 Drawing Sheets

Related U.S. Application Data 9,285,396, application No. 15/732,238, which is a continuation-in-part of application No. 15/330,129, filed on Aug. 11, 2016, now Pat. No. 9,799,193, which is a continuation-in-part of application No. 15/165,371, filed on May 26, 2016, now Pat. No. 10,359,453, which is a continuation of application No. 13/987,731, filed on Aug. 26, 2013, now Pat. No. 9,285,396.

(60) Provisional application No. 61/743,184, filed on Aug. 28, 2012.

(56) References Cited

U.S. PATENT DOCUMENTS

| | | | |
|---|---|---|---|
| 2002/0050932 A1* | 5/2002 | Rhoades | G08B 13/1965 340/870.16 |
| 2009/0271054 A1* | 10/2009 | Dokken | G01S 13/9307 701/21 |
| 2010/0270389 A1* | 10/2010 | Feldman | A01G 15/00 239/2.1 |
| 2014/0055283 A1* | 2/2014 | Ching | H04Q 9/00 340/870.02 |
| 2014/0062512 A1* | 3/2014 | Kiing, Jr. | G01R 19/00 324/713 |
| 2014/0062708 A1 | 3/2014 | Cargill, III | |
| 2015/0160178 A1* | 6/2015 | Lee | G01N 33/1886 73/61.43 |
| 2015/0198548 A1 | 7/2015 | Fournier | |
| 2016/0154036 A1 | 6/2016 | King, Jr. et al. | |
| 2017/0169685 A1 | 6/2017 | Easton | |

* cited by examiner

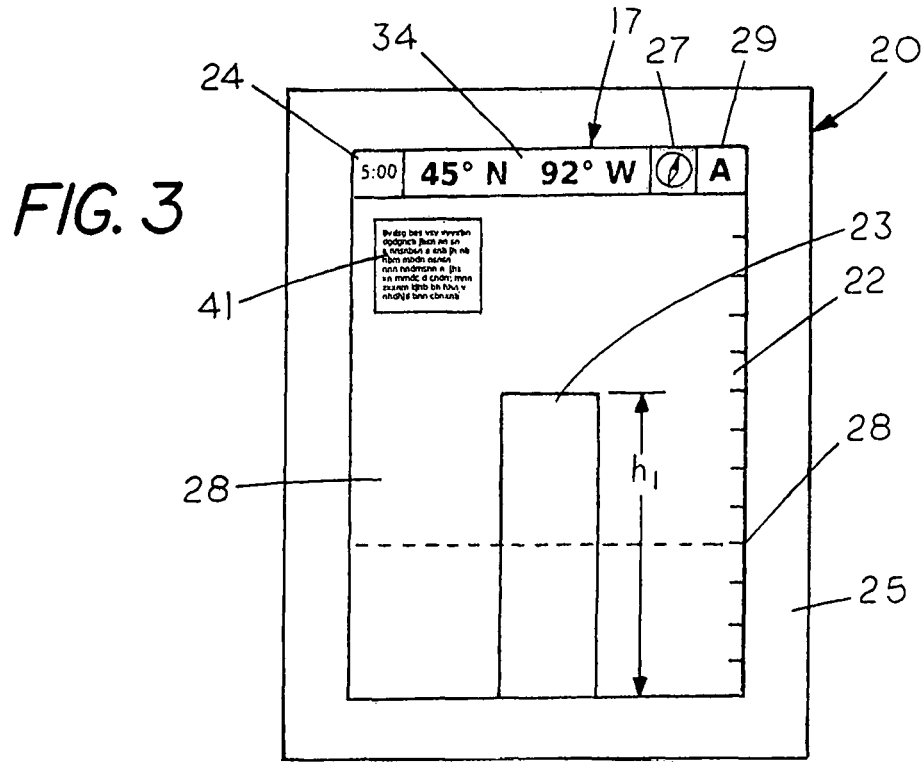
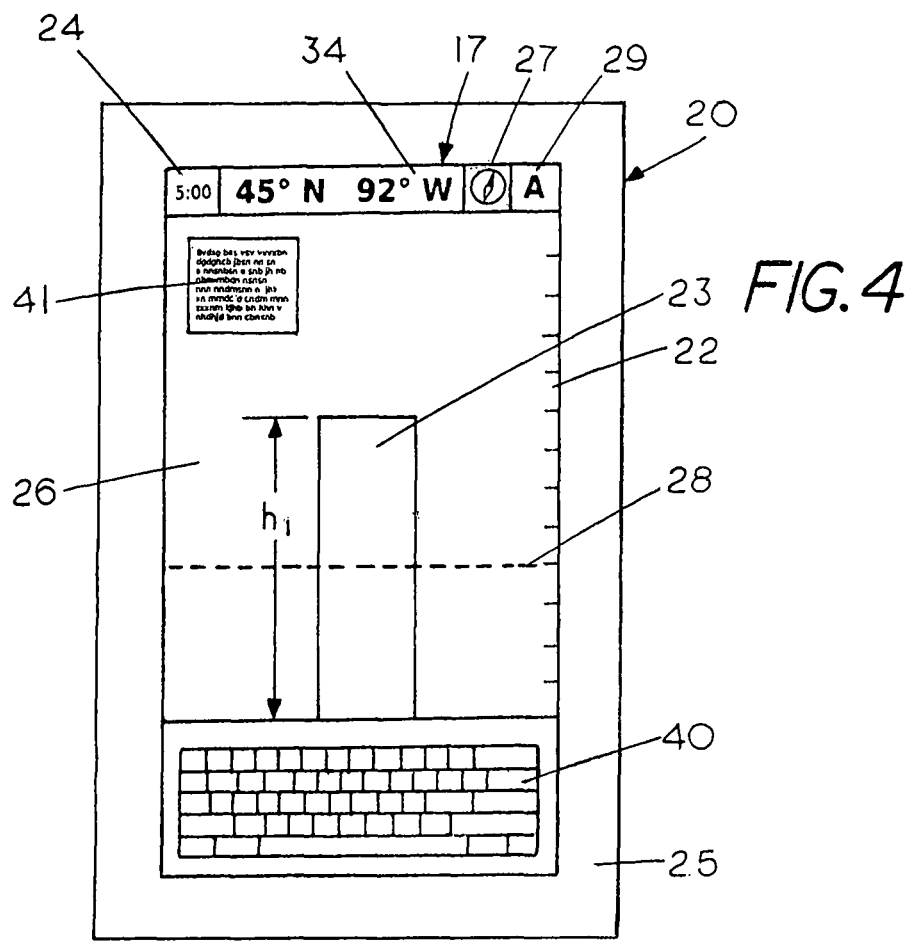

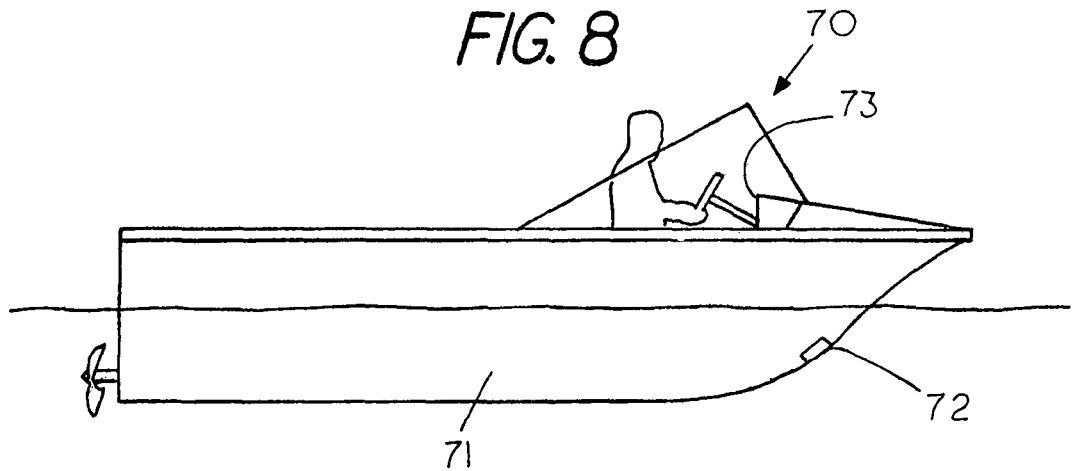
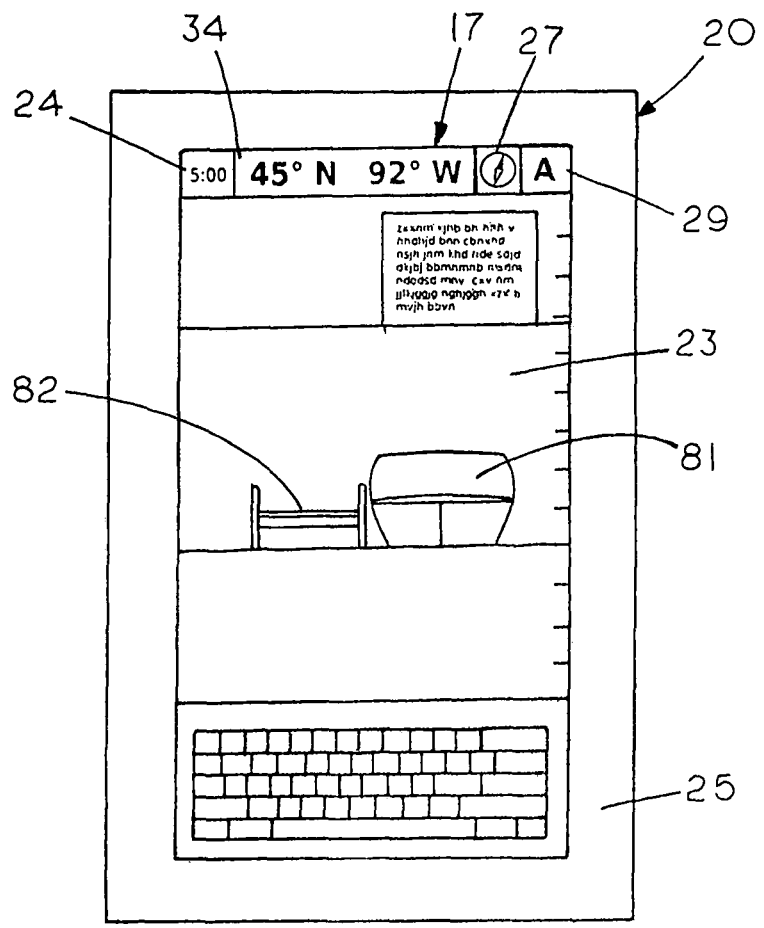

SHOCK AWARENESS SYSTEM

CROSS REFERENCE TO RELATED APPLICATIONS

This application is a continuation in part of U.S. Ser. No. 14/999,165 filed Apr. 5, 2016, which is a continuation in part of U.S. Ser. No. 14/998,497 filed Jan. 12, 2016 (now U.S. Pat. No. 9,678,119) which is a continuation of U.S. Ser. No. 13/987,731 filed Aug. 26, 2013 (now U.S. Pat. No. 9,285, 396), which claims benefit of provisional application 61/743,134 filed Aug. 28, 2012 and a continuation in part of U.S. Ser. No. 15/330,129 filed Aug. 11, 2016 which is a continuation in part of U.S. Ser. No. 15/165,371 filed May 26, 2016, which is a continuation of U.S. Ser. No, 13/987.731 filed Aug. 26, 2013 (Now U.S. Pat. No. 9,285, 396) which claims benefit of provisional application 61/743, 184 filed Aug. 28, 2012.

STATEMENT REGARDING FEDERALLY SPONSORED RESEARCH OR DEVELOPMENT

None

REFERENCE TO A MICROFICHE APPENDIX

None

BACKGROUND OF THE INVENTION

It is known that if a swimmer encounters a body of water with an electric field the swimmer can be electrocuted. The mere presence of the swimmer in the electric field causes the current flowing in the water to take a path of least electrical resistance through the swimmers body since the wet skin on a swimmer's body has a lower electrical resistance than the water surrounding the swimmer. If the voltage differential is sufficiently high the current flowing through the swimmer's body can electrocute the swimmer or paralyze the swimmer causing the swimmer to drown. In still other cases a non-swimmer may be electrocuted if he or she comes into incidental contact with a body of water, which has electrical leakage from an electrical source. In order to prevent unnecessary deaths warnings need to be made available to persons who may enter a body of water, whether it is a lake, pool or any other body of water. One of the difficulties is that oftentimes the source of leakage into the body of water may be sporadic or intermittent. Whether a persons is on shore or on a boat they need to be made aware that a body of water may contain an electrical condtion that could injure or kill a person entering into the body of water.

SUMMARY OF THE INVENTION

A shock awareness system including a mobile shock detector for detecting a hazardous electrical water condition where the hazardous electrical condtion detected may be an electrical current in a body of water, a voltage in the body of water or a voltage gradient in the body of water. The shock awareness system alerting a person to the existence of an electrical condtion in relation to a hazardous electrical condition in the body of water with the condition in the body of water viewable either at the shock detector or at a remote station, which may be located on shore or on a boat. The shock awareness system having a shock detector spatially coupled to a smart phone or the like with the shock awareness system monitoring, alerting and recording conditions in the body of water to provide historical information on hazardous electrical conditions in the body of water while allowing an operator to input instructions or to receive shock detector measurements in relation to hazardous water conditions as well as geographical location of the shock detector measurements. The shock awareness system useable as a stand-alone system or a system integrally incorporated into a boat, dock or other type of water associated device with the shock awareness system displaying a level of danger in the body of water in relation to an electrical condtion in the body of water that could injure or kill a person in the body of water. The shock awareness system capable of measuring and recording electrical conditions in the body of water to enable one to detect sporadic or intermittent hazardous electrical conditions in the body of water.

BRIEF DESCRIPTION OF THE DRAWINGS

FIG. 3 is an isolated view of the display screen of FIG. 2 showing a bar graph of the level of voltage proximate the floating shock detector in relation to a voltage that sufficient to cause injury or death to a person;

FIG. 4 is a front view of a computer and keyboard at a remote station that is in RF communication with the shock detector of FIG. 1;

FIG. 8 shows the shock detector mounted as an integral portion of a boat;

FIG. 9 is a remote station display obtained by a video camera located on the floating shock detector of FIG. 1.

DESCRIPTION OF THE PREFERRED EMBODIMENT

Figure 1:
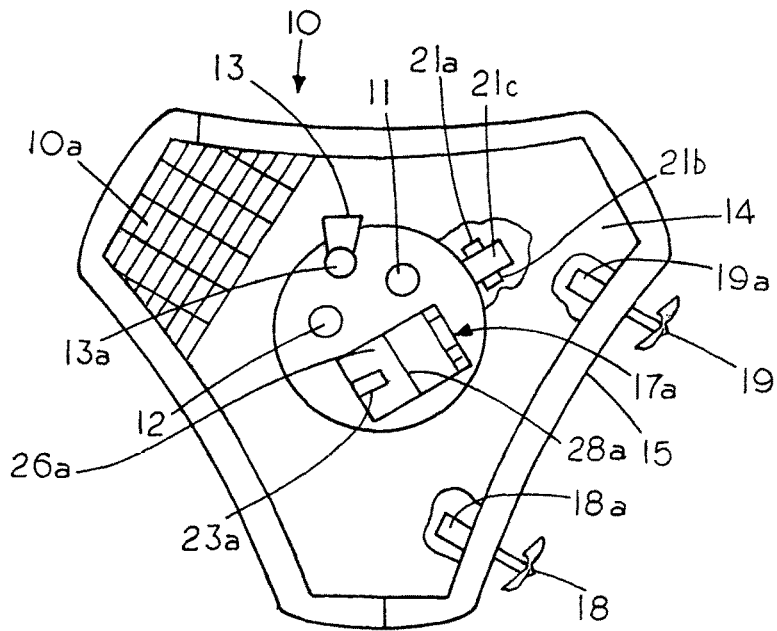
FIG. 1 is a top view of a mobile floating shock detector having a screen, a propulsion system, a solar panel, and a processor with RF capabilities for transmitting and receiving information with a remote processor.
Figure 1A:
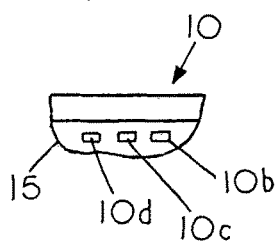
FIG. 1A is a front view of the mobile floating shock detector of FIG. 1 showing the water electrodes of the shock detector of FIG. 1.

FIG. 1 is a top view partial cutaway view revealing components within a mobile floating shock detector 10, which forms a first part of a shock awareness system. The shock detector 10 having electrodes 10b, 10c and 10d (FIG. 1A), which are normally located on the housing 10 and below a water line of the shock detector 10. The electrodes contactable with the body of water proximate the buoyant housing 15 to measure electrical conditions such as voltage or current or both in the body of water.

Figure 2:
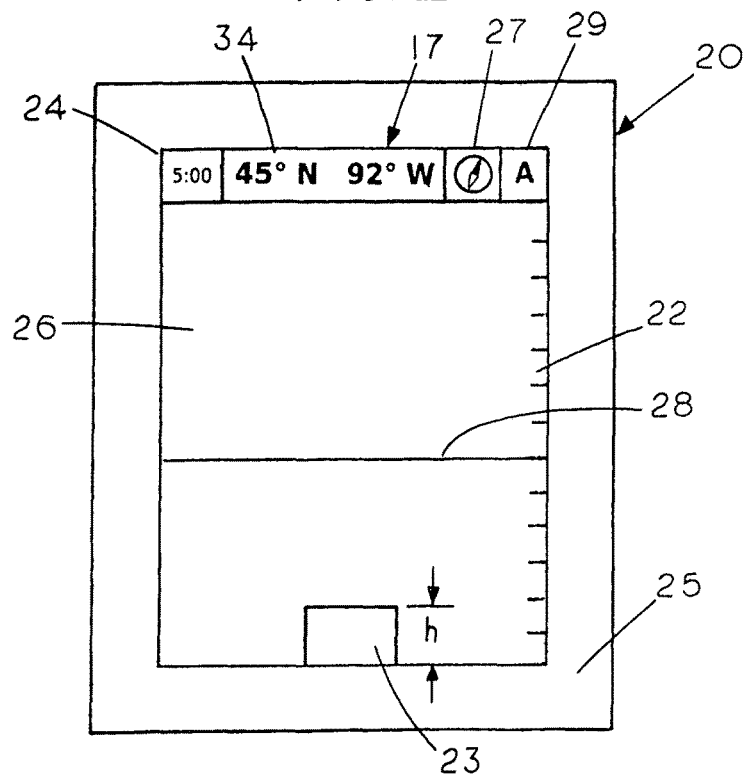
FIG. 2 is an isolated view of a shock awareness display screen located at a remote station that mirrors a shock awareness display screen on the mobile floating shock detector of FIG. 1.

FIG. 2 shows a remote station 20 that forms a further part of the shock awareness system. The shock detector 10, which is wirelessly coupled to the remote station 20, forms part of the shock awareness system. In this example the shock detector 10 includes a visual display screen 26a and the remote station 20, which also includes a viewing or visual display screen 26 located within a bezel 25. Shock detector 10 also includes, a propulsion system, which includes a first propeller 18 powered by a dc motor 18a and a second propeller 19 powered by a dc motor 19a with both motors 18a and 19a located in a waterproof buoyant housing 14. Motors 18a and 19a are powered independently of each other to provide for propulsion as well as steering and are controlled by an operator located at the remote station 20. That is an operator at the remote station 20 either through radio frequency or line communication with the shock detector can change the thrust of each of the propellers 18 and 19 to control the direction of the floating shock detector 10. For example, if both propellers provide equal thrust the shock detector moves forward, however, if one motor generates more thrust than the other the shock detector turns in response to the unequal thrust. Thus, a feature of the invention is that the shock detector 10 can be moved from place to place through the use of the two motors controlled at the remote station. Although the propulsion system uses dual dc motors other methods of controlling the direction of the shock detector may be used without departing from the spirit and scope of the invention. For example, a rudder may be used in conjunction with a single dc motors to control the direction of the shock detector 10. Other methods include using a single motor as a propulsion unit with the motor positionable to change the direction of thrust. While a dc motor has been described for use in the propelling system other methods or powering the shock detector may be used without departing from the spirit and scope of the invention. In some cases a cord may be attached to the shock detector and the shock detector moved about in the body of water by pulling on the cord.

A feature of shock detector 10 is a solar panel 10a, which is located on the topside of the housing 14. The solar panel 10a provides on-the-go charging of a dc battery 21b used for powering the dc motors 18a and 18b as well as powering an audio alarm 11 and a visual alarm 12 such as a light. A benefit of the solar panel is it can reduce or eliminate the need to periodically change the battery in the shock detector.

The housing 14 of shock detector 10 is shown partially cutaway in three locations with one cutaway revealing a processor 21c responsive to in electrical condtion in the body of water proximate the shock detector. As described herein the electrical condtion in the body water refers to the amount of voltage in the body of water. In some instance there will be no measurable voltage and in other instance there may be a measurable voltage where the voltage is sufficient low so that a person entering the body would not be harmed. The voltage may be measured with respect to ground or the voltage gradient may be obtained by measuring the voltage between probes. In either case one can compare the measured voltage or voltage gradient to a voltage or a voltage gradient that would cause injury or kill a person entering the body of water. A feature of the present invention is that the electrical condtion of the body of water can be visually compared to a known electrical condtion, for example through a bar graph 23 that visually displays the measured voltage 23 in relation to a voltage level 28 could injure or kill a person entering the body of water proximate the shock detector 10. Thus, the invention displays a level of danger to a person who may enter the body of water through the comparison of a measured electrical condtion to an electrical condtion that could injure or kill a person who entered the body of water.

In this example shock detector 10 includes a voltage detector responsive to a voltage from the two electrodes 10b and 10c with the shock detector measuring a voltage gradient in the body of water proximate the buoyant housing 15 although other methods of determining an electrical condition in the body of water that could injure or kill a person may be used. The processor 21c also includes transmission and receiver capabilities for wireless transmitting and receiving information with a remote station 20, which for example may be a lap top computer or a smart phone. Similarly, the remote station 20 also includes an internal processor for wireless receiving and transmission of information to the shock detector 10. In this example the processor 21c includes rf (radio frequency) transmission capabilities between the shock detector 10 and the remote station 20 that allow information measured proximate shock detector 10 to be displayed on screen 26 and screen 26a. Shock detector 10 also includes a GPS (Global Position System) chip or GPS locater or tracker 21a that determines a geographical position of the shock detector 10. In this example, the shock detector 10 can continually display GPS information 34 on the top portion of screen 26 as well as on shock detector screen 26a, however, if the remote station 20 is being used to control the shock detector the screen 20a may be deactivated if so desired. The transmitter/receiver for communication between the processor 21c and the processor in remote station 20 is located in the housing 14 and in remote station 20. The transmission of information from and to remote station 20 may be done through use of radio frequencies ranging from 9 kilohertz to 300 gigahertz. In some cases one may use Wi-Fi frequency (2.4 gigahertz or 5 gigahertz) or Bluetooth™ short-range wireless frequency (2400 megahertz to 2483.5 megahertz). In other methods optical communication such as laser communications may be used between the shock detector 10 and the remote station 20. The type of communications used may depend on the distance between the floating shock detector 10 and the remote station 20. For example, if a remote station is located many miles from the shock detector the use of lower rf frequency that can travel farther than the higher rf frequencies may be preferred, while for other applications such as in or around pools another type of frequency may be used. Thus the shock detector may contain only one type of communication system or in some cases the shock detector may have multiple types of wireless communication systems with the processor having the ability to select the frequency and the system that is most effective for the field application. This feature provides the operator the ability to work in various types of weather conditions as well as avoiding frequencies used for other purposes. Both the processor in the remote station 20 and processor 31 in the shock detector 10 include memory units for storing informations including measured voltage or measured voltage gradient as a function of time and location. In addition processor 21c transmits battery power status of the battery 21b in the shock detector 10 to the processor in the remote station 20 thereby alerting a person as to the operative condition of the shock detector 10, a useful feature if the shock detector 10 is battery powered. A further feature of the invention is that both the processor 21c and the processor in the remote station 20 include the capability to send information to the cloud for later access.

In this example the screen 26a of shock detector 10 includes a visual information display area 17a and the screen 26 of remote station 20 also includes an identical visual information display area 17. The display area reveals ongoing information regarding the shock detector 10. For example, time 24 is displayed on both the shock detector 10 and remote station 20. Also available is the location 21 of the shock detector 10 as well as a compass 27 that provides orientation of the shock detector 10. If two or more shock detectors are in use a shock detector identifier 29 identifies the shock detector that is currently monitoring and transmitting field information to remote station 20. A feature of the shock awareness system is that the information on the electrical condition of the body of water can be simultaneously displayed on a display screen 26a at the shock detector 10 and at a display screen 26 at the remote station 20.

Located on top of shock detector 10 is a video camera 13 with the camera orientation as well as the camera operation controllable through remote station 20. Camera 20 transmits field images to remote station 20. In some applications the video camera 20 may be maintained in a fixed position on the shock detector 10 and the images viewed at the remote station 20 through movement of the shock detector 10. In other cases the video camera 13, which is mounted on a ball pivot 13a, may be repositioned on the shock detector 10 though a signal from remote station 20. This feature allows a person at the remote station to view images above the shock detector or around the shock detector by electronically repositioning the video support 13a. Thus, the shock detector includes the method of on water viewing of objects proximate the shock detector 10. This feature is useful if the shock detector 10 is being used as a tool to locate a source of voltage leaking into the water or to check for persons proximate the shock detector 10.

FIG. 2 is an isolated view of remote station 20 with a display screen 26. In this example, the display screen 26, is an LCD screen although other types of screens may be used. The display screen 26 includes an information band 17 located along the top of the screen 26. The information band 17 displays time 24, shock detector GPS position 34, shock detector orientation 27 well as a shock detector identifier 29 that identifies the shock detector currently transmitting data to remote station 20. Typically, the information on band 17 remains on the screen while other portions of screen 26 provide updated information on an electrical shock hazard in the body of water proximate the shock detector 10. Thus, a feature of the shock awareness system is that a remote operator can quickly determine the position of a shock detector as well as the electrical condition proximate the shock detector.

Located along the right side of screen 26 is a vertical scale 22, which typically is in volts. A line 28, which extends across the screen 26, represents a water voltage that may cause injury of death to a person entering a body of water proximate the shock detector. A feature of the invention is that the actual voltage measured in the water proximate the shock detector 10 is shown in a bar graph 23. In this example, the voltage in the water is indicated by the height $h_2$ of the bar graph 23. FIG. 2 shows the height $h_2$ of the bar graph 23 is below the voltage level 28 that could cause injury or death to a person in the body of water. A feature of the invention is that not only does the shock detector 10 measure and display measured voltage or the voltage gradient in the body of water it displays the measured voltage or voltage gradient on screen 26 with relation to a voltage level 28 that could injure or kill a person in the body of water. In this example the visual display screen 26a on buoyant housing 15 shows the same information as the visual display screen 26 at remote station 20. That is display screen 26 and 26a both display a bar graph that shows an electrical water condtion in relation to at least two zones with a first zone below line 28, which is non harmful to humans, and a second zone above line 28 that can injure or kill a person who enters the body of water.

In this example, the shock detector 10 provides warnings to alert a person of possible electrocution danger in the water if the bar graph height h exceeds level 28, however, it also provides a "caution status". That is, in most bodies of water there exists a background voltage, which is not harmful to a person. A "caution status" is an indication that the voltage level is below the voltage level 28 that could kill or injure a person but above a normal background voltage. The "caution status" also alerts a person that while the area around the shock detector is considered safe areas further removed from the shock detector should be checked for voltage levels, as there may be other nearby water areas where the voltage level may be unsafe. Thus the "caution status" alerts the shock detector to check the voltage at different locations since there may be other water regions nearby that could kill or cause injury to a person in the body of water. With the invention described herein the remote station 20 can be used to transmit signals to the shock detector 10 to search for nearby areas that contain a higher voltage. As shown in FIG. 2 visual_display screen 26a on buoyant housing 15 displays a bar graph voltage 23a and visual display screen 26 on remote station 20 displays a voltage bar graph 23 comprising an analog display of the voltage in relation various danger zones. For example, a first zone that is non harmful to humans (i.e. no visible bar graph on the display screen or only background voltage) and a second zone of caution (below line 28 but above any background voltage) that maybe harmful to humans and a third zone (above line 28) that can injure or kill a person who enters the body of water. Thus, a feature of the system is the ability to allow one to quickly determine the relative safety or potential electrical harm in the water through measurement of an electrical danger in the water such as a water voltage or a water voltage gradient in the body of water where the voltage gradient is difference of voltage between two positions in the water and may be expressed as volts per inch.

FIG. 3 and FIG. 4 show the remote station 20 as shock detector 10 measures a harmful voltage proximate the shock detector 10. The voltage level h, is displayed in bar graph form. In this example the voltage level $h_1$ shown by bar graph 23 is above the voltage level 28 that would cause injury or harm to a person in the water. A further feature of the invention is that the processor 21 on the shock detector 10 and the processor on the remote station 20 cooperate to record the voltage level as a function of time and location and displays the information to a viewer information panel 41 on screen 26, which may be a touchpad screen.

While FIG. 4 shows remote station 20 with a mechanical keyboard 40 for inputting and retrieving information from the shock detector an onscreen keyboard, which may be part of screen 26 may be used to input and record information on the shock detector. In this example an operator of the remote processor in station 20 can add comments to the voltage information proximate the shock detector 10 for later retrieval by storing the information in the memory of the processor on the shock detector 10 or in the processor in the remote station 20. The keyboard 40 or the touch pad screen 26 may also be used move the shock detector 10 about in the body of water through the use of the dc motors 18a and 19a on the shock detector 10. Thus, a feature of the invention is the remote control of the shock detector as well as the remote measurements of voltage conditions proximate the shock detector 10 controlled through the remote station 20.

Figure 5:
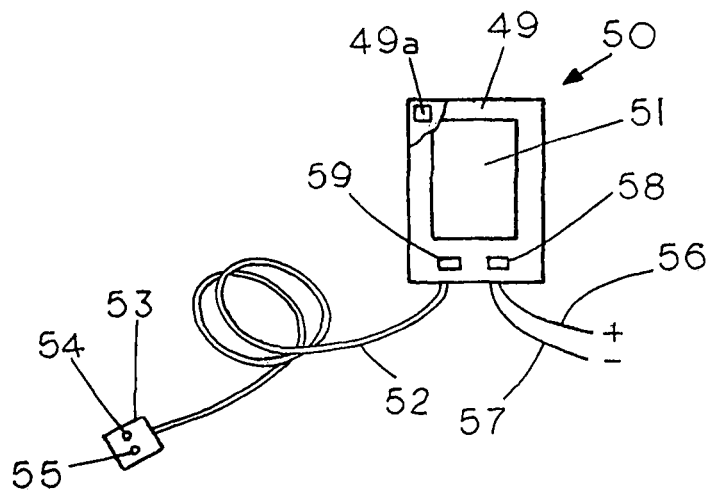
FIG. 5 is an aftermarket shock detector kit for attachment to a marine vessel such as runabout.
Figure 6:
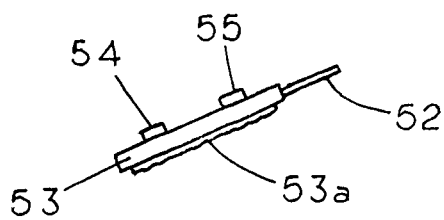
FIG. 6 is an isolated view of the electrode panel that is securable to the hull of a boat.
Figure 7:
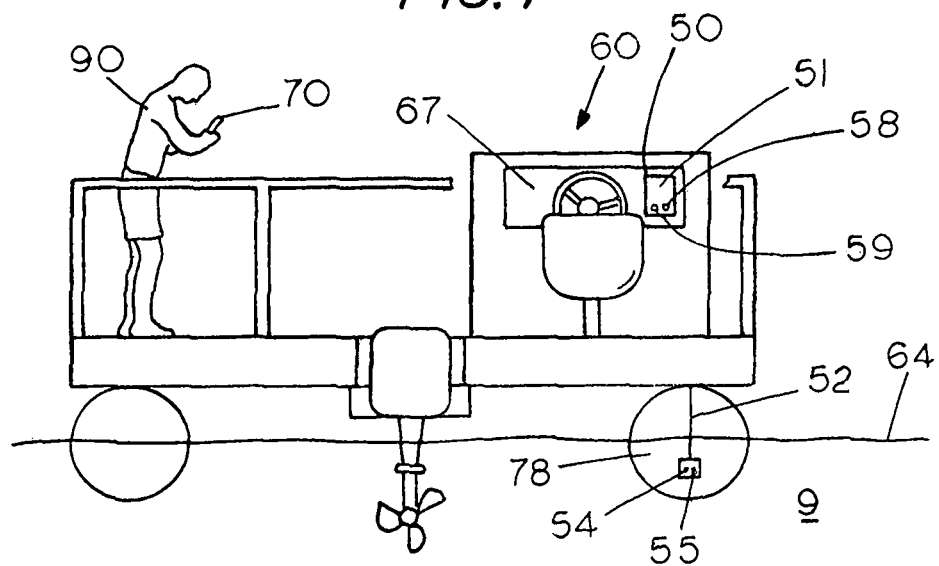
FIG. 7 shows the aftermarket shock detector of FIG. 5 mounted on a pontoon boat.

FIG. 5, which is partially in section, shows an example of an aftermarket shock awareness kit 50 having a voltmeter 49a located in housing 49 with electrodes 53 and 54 attachable to a structure such as a boat or a dock through an adhesive pad 53 to enable the electrodes to come into contact with a body of water while the shock detector display 51 remains out of the water and visible. In this example the kit 50 includes leads 56 and 57 for connection to an external power source although a battery may be attached for powering the shock detector, which comprises voltmeter 49a. FIG. 6 is an isolated side view of pad 53 revealing the electrodes 54 and 55 on one side of the pad 53 with an adhesive 53a located on the opposite side for mounting the pad 53 to the hull of a boat. Although an adhesive is shown other methods of securing the pad including screw fasteners may be used without departing from the spirit and scope of the invention. The electrodes 54 and 55, which are located below the water line of a boat, connect to the voltmeter 49a or other electrical measuring device and the shock detector display screen 51 where a measured water voltage level or other harmful electrical condition can be displayed. In this example a water voltage is shown in bar graph form in FIG. 2 or FIG. 3. Alternately, the shock detector can be set so that when the voltage exceeds a voltage that could injure or kill a person an audible alarm 58 and a visual alarm 58 alert a person that the boat is in hazardous water that could kill or injure a person in the water. In this example the shock detector 49a includes a voltmeter therein to measure electrical information and displays the information on a screen 51, which is attachable to a display panel 67 on a boat 60 as shown in FIG. 7. Although voltage is measured with a voltmeter other methods of measuring the electrical condition in the body of water may be used.

FIG. 7 shows a shock detector 50 located on a control panel 67 of pontoon boat 60. In this example the electrodes 54 and 55 are secured below the water line 64 with the electrodes in communication with display screen 51 through an electrical lead 52. A shock detector display 51 includes a visual alarm 58 and an audible alarm 59 mounted on the boat 60 to alert a person to the presence of an electrical condition such as the level of voltage in the water and if the level of voltage may injure or kill a person who enters the body of water. This feature is useful for pontoon boats since persons may swim from the pontoon boat as it floats in a lake. The presence of the shock detector 50 on the boat can alert swimmers to the fact that the water area proximate the boat 60 is not safe to swim in because of a hazardous electrical conditions such as voltage in the water that may injure or kill a person who enters the body of water. Thus, the shock detector 50 can be mounted on a boat to provide information on the water with the information on the electrical condtion in the water displayable on either screen 51 and on a hand held remote such as a smart phone 70. In some cases one may want persons on board to monitor the water conditions through the shock detector display 51 and in other cases one may want a person 9 on board the boat to monitor the water conditions through their own remote such as a smart phone 70 that is wirelessly coupled to the shock detector output. A feature of the invention is that a shock awareness signal from the shock detector 50 can be transmitted for receipt by members of the public who have a smart phone or the like thus enabling a person entering an area to determine if harmful electrical conditions are present in a body of water.

FIG. 8 shows another example of use of the shock awareness system with a boat such as a runabout 70 having a shock detector pad 72 as an integral component of the hull 71. In this example, the electrical water condtion information is provide to a panel 73 on boat 70 with the panel including visual and audible alarms to alert a person that the voltage proximate the hull may cause injury or death to a person. The voltage may be displayed in bar graph form on panel 23 or it may be displayed on a remote station such as a smart phone but in either event the information can be announced to the boat operator through audible and visual alarms.

As illustrated herein the invention in FIGS. 5, FIG. 6 and FIG. 7 the invention includes a method of monitoring a body of water 9 to determine if the body of water contains an electrical condtion that could injure or kill a person entering the body of water by placing a set of electrodes 54,55 from a shock detector 50 in contact with the body of water 9. One can then establish RF communications between a remote station 20 or 70 and the shock detector 50. One can then measure the electrical condition in the body of water to obtain a measured electrical condtion proximate the boat 60. One can then display the measured electrical condtion in bar graph form with respect to the electrical condtion in the body of water that could injure or kill a person as shown in FIG. 4. The invention further includes the step of displaying information on a geographical location 34 of the shock detector and a time 24 of measuring the electrical condtion in the body of water. While the electrodes 54 and 55 may be mounted during the building of a boat 60 the invention herein includes the step of mounting the electrodes 54 and 55 on a pontoon hull 78 or a boat hull 71. Note, in the method described herein the remote station 70 and the shock detector 61 are located on boat 60 as shown in FIG. 7. A further feature of the invention may include the step of charging a battery 17 in the shock detector 10 with a solar panel 10a on the shock detector. An advantage of the method described herein is that it enable one to remotely monitor a region proximate the shock detector with a camera, such as a video camera 13 located on the shock detector 10 with the video cameral controllable from the remote station 20. As can be seen in FIG. 1 the method includes the step of simultaneously displaying the electrical condition in the body of water on a display screen 20a on the shock detector and a display screen 26 on a remote station 20.

FIG. 9 show the remote station 30 when the camera 13 on the shock detector is used through operation of the remote station 20. In this example the camera 13 displays the image of a boat 81 next to dock 82. Thus, a feature of the invention is not only can the shock awareness system warn of harmful conditions it can view areas proximate the shock detector 10 with the information transmittable to the remote station 20 to enable a person at the remote station to determine if there are persons proximate the shock detector 10 who may not be aware of hazardous water conditions.

While kit 50 may be attached to a boat or the like a further feature of kit 50 is that the electrodes 53 and 55 can be mounted on a small device that floats in the water with the electrical lead 52 that extends between the display 51 and electrodes 54 and 55 comprising a tow strap for moving the floating device with the electrodes about in the body of water. This feature is useful when a person uses the kit 50 as a test device in order to locate where an electrical condtion in the body of water may be most harmful by pulling the electrodes through the body of water while viewing a hand held display screen 51.

A further advantage of kit 50 is that the shock detector display screen 51 may be mounted on a dock post or the like with the electrodes immersed in the body of water. In this mode the kit 50 provides for a stationary system to alert a person to a harmful electrical condition in a body of water. Thus kit 50 may be used in a number of different locations and a number of different places.

Figure 10:
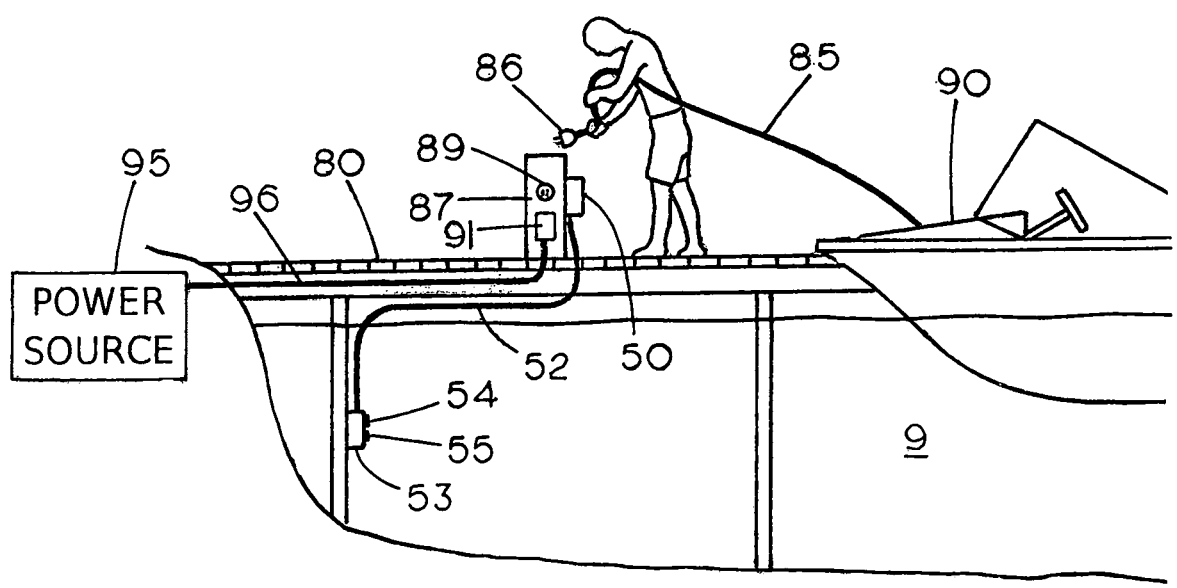
FIG. 10 shows a dock with a person about to connect the boat electrical system to a shore power outlet on a stand on the dock.

FIG. 10 shows a dock 80 with a boat 90 moored next to the dock. While the boat is docked the boat owner may not want to use the boat battery or boat generator to provide electrical power to the boat, particularly if the boat is to be docked for an extended period of time. While the boat is docked one can connect the boat electrical system to electrical shore power, which is available at outlet 89 on a conventional dock power stand 87. Dock power stands are known in the art and are typically mounted on top of a dock with the power stand containing an electrical outlet for supplying electrical power to tools or a boat proximate the dock. In this example a boat 90 contains a power cord 85 having an electrical plug 86 for quick connection of the boat electrical system to the onshore source of power 95 available at a power stand electrical outlet 89 through electrical line 96. Unfortunately, if boat 90 has faulty electrical wiring the connection of the boat electrical system to the onshore source of power 95 can unknowingly introduce harmful voltage into the water 9 through the faulty electrical wiring of the boat thus unknowingly electrifying the water proximate dock 80. Since a person may have stepped off of the boat and directly onto the dock the person may not even be aware that they introduced voltage into the water through the connection of the boat electrical system to onshore source of power 95 in the power stand. Unfortunately, a person who comes into contact with electrified water proximate the dock 80 is not so fortunate and may be electrocuted.

To prevent electrification of the water due to faulty boat wiring a shock detector 50 is attached to the dock power stand with the shock detector electrical lead 52 extending to the pad 53 with electrodes 54 and 55 located in the water proximate the dock. The shock detector 50 determines if the water contains an electrical condtion that could injure or kill a person. In this example the onshore power 95 or a battery may power the shock detector 50. The alarm 58 and alarm 59 on the shock detector 50 provide an immediate warning to a person connecting the plug 86 to the outlet 89 if the boat electrical system is faulty since voltage that leaks into the water is sensed by the electrodes 54 and 55, which activates the alarms 58 and 59 on the shock detector 50.

In some cases the faulty boat electrical wiring may be sporadic so that the alarms 58 and 59 (FIG. 5) are not activated until a person has left the dock. In order to prevent electrification under such conditions at least one of the alarms i.e. 58 or 59 on the shock detector 50 also connects to switch 91, for example a solenoid switch or the like, that immediately shuts off the power to outlet 89 in response to an alarm signal thereby preventing electrification of the water proximate the boat. Thus in one example the shock detector 50 can be coupled to a power stand to independently warn of harmful water condtion and in another example the shock detector can warn of immediate water danger as well as shut off the electrical power to the outlet 89 in the event of a faulty boat wiring system.

We claim:

1. A shock awareness system comprising:
   a mobile shock detector for measuring an electrical condition in a body of water proximate the mobile shock detector through a first electrode and a second electrode located on a buoyant housing with the buoyant housing including a propulsion unit for moving the buoyant housing about on the body of water;
   a processor located on said mobile shock detector;
   a visual information display area on said mobile shock detector with said visual information display area revealing ongoing information regarding the electrical condition proximate the shock detector on a display screen located in the visual information display area with the display screen including a voltage scale thereon defining a first zone that is non harmful to humans, a second zone that maybe harmful to humans and a third zone that can injure or kill a person who enters the body of water wherein the electrical condition measured in the body of water proximate the mobile shock detector is displayed on the display screen as a bar graph of a water voltage in relation to a line on the display screen that represents a water voltage that could injure or kill a person who enters the body of water;
   a GPS locater on said shock detector for determining a geographical position of the shock detector when measuring the electrical condition in the body of water proximate the mobile shock detector;
   a remote processor physically spaced from said buoyant housing with said remote processor comprising a laptop computer or a smart phone with the remote processor having a further visual information display area with a further display screen including a voltage scale thereon defining a first zone that is non harmful to humans, a second zone that maybe harmful to humans and a third zone that can injure or kill a person who enters the body of water wherein the electrical condition measured in the body of water proximate the mobile shock detector is displayable on the display screen or the further display screen as a bar graph of a water voltage in relation to a line on the display screen that identifies a voltage that could injure or kill a person who enters the body of water; and
   a transmitter/receiver for communication between the processor located on the housing and the remote processer wherein information in the processor on the buoyant housing can be accessed through the remote processor or the processor on the buoyant housing to provide information on the electrical condition proximate the shock detector as the shock detector moves about in the body of water.

2. The shock awareness system of claim 1 wherein the shock detector includes a solar panel for maintaining a charge on a battery located in the shock detector.

3. The shock awareness system of claim 1 wherein either the shock detector or the remote processor transmits information regarding the electrical condition to a cloud storage.

4. The shock awareness system of claim 1 wherein the shock detector transmits a battery power status to the remote processor.

5. The shock awareness system of claim 1 wherein an operator at the remote processor can enter information into a processor in the shock detector for retrieval from the processer or the remote processor at a later time.

6. The shock awareness system of claim 1 wherein the shock detector includes a GPS (global position system) locater.

7. An onboard shock awareness system comprising:
   a boat having a hull;
   a display monitor in said boat;
   a shock detector including a voltage sensing unit having a pad with a pair of electrodes thereon proximate the boat hull with said voltage sensing unit in communication with said display monitor, said display monitor including a visual information display area on said mobile shock detector with said visual information display screen revealing ongoing information regarding an electrical condition proximate the shock detector with the display screen including a voltage scale thereon defining a first zone that is non harmful to humans, a second zone that maybe harmful to humans and a third zone that can injure or kill a person who enters the body of water wherein the electrical condition measured in the body of water proximate the mobile shock detector is displayed on the display screen as a bar graph of a water voltage in relation to a line on the display screen that represents a voltage that could injure or kill a person who enters the body of water.

8. The onboard shock awareness system of claim 7 where the voltage sensing unit and the display monitor is an aftermarket shock awareness system with the voltage sensing unit either temporarily or permanently secured to the boat hull and the shock awareness system including electrical leads for connecting to a power source on a boat.

9. The onboard shock awareness system of claim 7 including:
   a GPS locater on said shock detector; and
   a processor for storing and recording information on the electrical condition in the body of water in relation to the harmful electrical condition that could injure or kill a person entering the body of water, a time and a GPS location of the shock detector in the body of water.

10. The shock awareness system of claim 7 wherein the shock detector is an aftermarket system with the shock awareness system including a display screen physically spaced from said buoyant housing with said display screen comprising a smart phone display screen with an audible or visual alarm thereon to alert a person to the harmful electrical condition in the body of water wherein the harmful electrical condition comprises a harmful voltage gradient that could injure or kill a person entering the body of water.

11. The shock awareness system of claim 7 including a video camera on said shock detector.

12. The shock awareness system of claim 7 wherein the shock detector includes a battery with the shock detector having a solar panel for on-the-go charging the battery in the shock detector.

13. The shock awareness system of claim 7 wherein the shock detector can determine the presence of an electrical current in the body of water that is insufficient to cause harm or injury to a person in the body of water in relationship to electrical current in the body of water that is sufficient to cause harm or injure to a person in the body of water.

* * * * *